United States Patent [19]
Crisenza et al.

[11] Patent Number: 5,977,586
[45] Date of Patent: Nov. 2, 1999

[54] NON-VOLATILE INTEGRATED LOW-DOPED DRAIN DEVICE WITH PARTIALLY OVERLAPPING GATE REGIONS

[75] Inventors: Giuseppe Crisenza, Trezzo sull'Adda; Cesare Clementi, Busto Arsizio, both of Italy

[73] Assignee: STMicroelectronics S.r.l., Agrate Brianza, Italy

[21] Appl. No.: 08/455,570

[22] Filed: May 31, 1995

Related U.S. Application Data

[62] Division of application No. 08/129,689, Sep. 30, 1993, Pat. No. 5,464,784.

[30] Foreign Application Priority Data

Sep. 30, 1992 [EP] European Pat. Off. .............. 92830542

[51] Int. Cl.⁶ ....................... H01L 29/792; H01L 29/788; H01L 29/76; H01L 29/94
[52] U.S. Cl. .......................... 257/326; 257/315; 257/316; 257/344; 257/408
[58] Field of Search ................... 257/408, 344, 257/314, 315, 316, 319, 320, 326

[56] References Cited

U.S. PATENT DOCUMENTS

| | | | |
|---|---|---|---|
| 3,984,822 | 10/1976 | Simko et al. ............................ | 257/316 |
| 4,780,431 | 10/1988 | Maggioni et al. ....................... | 437/52 |
| 4,808,544 | 2/1989 | Matsui .................................... | 437/44 |
| 4,997,777 | 3/1991 | Boivin .................................... | 437/38 |
| 5,034,791 | 7/1991 | Kameyama et al. ..................... | 257/408 |
| 5,053,849 | 10/1991 | Izawa et al. ............................. | 257/408 |
| 5,104,819 | 4/1992 | Freiberger et al. ...................... | 437/43 |
| 5,120,668 | 6/1992 | Hsu et al. ................................ | 437/41 |
| 5,175,119 | 12/1992 | Matsutani ................................ | 437/43 |
| 5,202,277 | 4/1993 | Kameyama et al. ..................... | 437/41 |
| 5,273,923 | 12/1993 | Chang et al. ............................ | 257/314 |
| 5,326,999 | 7/1994 | Kim et al. ............................... | 257/315 |

FOREIGN PATENT DOCUMENTS

| | | | |
|---|---|---|---|
| A-0049392 | 4/1982 | European Pat. Off. ............... | 257/316 |
| A-2 673 326 | 12/1991 | France .................................... | 257/408 |
| 3813665 A1 | 11/1988 | Germany ............................... | 257/408 |
| A-4105636 | 2/1991 | Germany ............................... | 257/408 |
| 54-12565 | 1/1979 | Japan ..................................... | 257/316 |
| 5-21811 | 1/1993 | Japan ..................................... | 257/408 |

OTHER PUBLICATIONS

J.E. Moon et al., "A New LDD Structure: Total Overlap With Polysilicon Spacer (TOPS)," *IEEE Electron Device Letters*, vol. 11: No. 5, pp. 221–223, May 1990.

T. Huang et al., "A New LDD Transistor with Inverse–T Gate Structure," *IEEE Electron Device Letters*, vol. EDL–8, No. 4, pp. 151–153, Apr. 1987.

D.S. wen et al., "A self–Aligned Inverse–T Gate Fully Overlapped LDD Device for Sub–Half Micron CMOS," *International Electron Devices Meeting 1989, Technical Digest*, pp. 765–768, Dec. 1989.

*Primary Examiner*—Steven H. Loke
*Attorney, Agent, or Firm*—David V. Carlson; Seed & Berry LLP

[57] ABSTRACT

A non-volatile integrated device having first and second dimensionally different polysilicon gate layers separated by an oxide layer for hot-carrier reliability. More specifically, the oxide and second polysilicon gate layer are selectively etched to form a second gate region over the first polysilicon gate layer that electrically contacts the first polysilicon gate in one direction and is isolated by the oxide in the other direction. Insulating sidewalls are formed over the first polysilicon gate layer regions that are not electrically contacted by the second gate layer to help isolate the second polysilicon gate and form an LDD structure within the substrate for the device.

9 Claims, 3 Drawing Sheets

NON-VOLATILE INTEGRATED LOW-DOPED DRAIN DEVICE WITH PARTIALLY OVERLAPPING GATE REGIONS

RELATED APPLICATIONS

This application is a divisional application from prior U.S. application Ser. No. 08/129,689 filed Sep. 30, 1993, now U.S. Pat. No. 5,464,784, titled "METHOD OF FABRICATING INTEGRATED DEVICES, AND INTEGRATED DEVICE PRODUCED THEREBY." This application claims priority from European patent application No. 92830542.4 filed Sep. 30, 1992, which is incorporated herein by reference. This application is closely related to a U.S. application filed concurrently herewith titled "Method of Fabricating Non-Volatile Memories and Non-Volatile Memory Produced Thereby" which related application claims priority from European patent application No. 92830541.6 filed on Sep. 30, 1992.

DESCRIPTION

1. Technical Field

The present invention relates to integrated devices, and more particularly to the integrated low-doped drain devices with partially overlapping gate region.

2. Background of the Invention

In recent years, for integrated circuit transistors in general, a so-called ITLDD (Inverse T Low Doped Drain) structure has been devised, which has the advantage of withstanding the hot electron injection stress typical of submicrometer structures. For this reason, the ITLDD structure is among the most favored for transistors with gate lengths below 0.5 $\mu$m but presents serious difficulties in terms of production and industrialization, as outlined below.

The first proposal for such a structure appeared in 1986 (cf. articles by HUANG T. Y. and others entitled "A novel submicron LDD transistor with inverse-T gate structure" IEEE-IEDM 1986, p. 742, and "A new LDD transistor with inverse-T gate structure" IEEE Electron Dev. Letters, 8, 1987, p. 151). These deal with a standard transistor in which the etching for defining the gate region is stopped at a certain level to give the desired structure, but not without obvious problems in terms of etching controllability and repeatability. So much so that, in the second of the above articles, alternative solutions are outlined for simplifying the etching stage, and, in a follow-up proposal, recourse is made by the same writer to two distinct gates, one wider and the other narrower, contacted by polysilicon spacers.

An alternative to the above process is described, for example, in an article by IZAWA R. and others entitled "Impact of the Gate-Drain Overlapped Device (GOLD) for deep submicrometer VLSI" IEEE Transactions Elect. Dev 35, 1988, p. 2088. According to this process, which was later to become widely used, a first thin polysilicon layer is deposited; a very thin layer of native oxide (5–10 Å) is grown by exposure to air; a second polysilicon layer is deposited on the oxide layer; the second polysilicon layer is etched highly selectively, so as to stop at the thin oxide layer; the low-doped regions are implanted through the native oxide layer, the first polysilicon layer and the gate oxide layer; an LPCVD (Low Pressure Chemical Vapour Deposition) oxide layer is deposited and etched to define the lateral spacers; the first thin polysilicon layer is etched; partial lateral re-oxidation of the thin polysilicon layer is effected; and the high-doped regions are implanted. In this way, overlapping of the transistor gate region and the low-doped regions does not depend on the size of the spacers.

The above known process is especially critical as regards selective etching of the second polysilicon layer, which requires extremely selective technology (100 to 1 is the figure mentioned) for selecting between the polysilicon and oxide, if the etching process is to be repeatable uniformly on a silicon wafer. What is more, no direct contact exists between the gate region parts separated by the native oxide layer, which, albeit thin, could impair electrical continuity. Finally, precise control of the lateral oxidation length of a doped polysilicon layer is not as straightforward as it would at first appear.

To overcome the above drawbacks, further processes have been proposed, such as that described in an article by PFIESTER J. and others entitled "A self-aligned LDD/channel implanted ITLDD process with selectively-deposited poly gates for CMOS VLSI" IEEE-IEDM, 1989, p. 253). This consists in forming the gate regions inside openings in an appropriate oxide layer over the first polysilicon layer; removing the oxide layer; implanting the low-doped regions; forming oxide spacers; and implanting the high-doped regions.

The process described in an article by MOON J. E. and others entitled "A new LDD structure: Total Overlap with polysilicon Spacer (TOPS)" IEEE Electron Dev. Letters, 11, 1990, p. 221, consists in forming appropriately thick polysilicon spacers for electrically contacting the top part of the gate region, formed from a thick polysilicon layer, and the bottom part of the gate region, formed from a thin polysilicon layer and separated from the first by an oxide layer. In this case, the low-doped regions are implanted through the oxide and thin polysilicon layers prior to forming the spacers, and the high-doped regions are implanted after they are formed.

In the process described in an article by WEN D. S. and others entitled "A self-aligned inverse T fully overlapped LDD device for sub-half micron CMOS" IEEE-IEDM, 1989, p. 765, the problem of contacting the two parts of the gate region is solved by depositing a thin polysilicon layer after defining the thicker part of the gate region and before defining the oxide for the spacers, which obviously complicates the process by introducing additional deposits and etching. In this case also, a dummy oxide or TiN layer is used for arresting etching of the polysilicon in the thicker part of the gate region, thus resulting in selectivity problems, especially when overetching.

Other processes proposed for fully overlapping the gate region and low-doped regions (cf. the article by HORI T. and others entitled "A new submicron MOSFET with LATID (Large-tilt angle implanted drain) structure" Int. Symp. VLSI Technology Dig. 1988, p. 15) consist in implanting the above regions by sharply tilting the beam and semiconductor wafer. Such a technique presents difficulties in controlling the junction profile, and, what is more, results in direct injection of the charge into the gate oxide.

All the above processes (and others not mentioned) have met with only a limited amount of success, due to the manufacturing difficulties involved, and at any rate are limited in scope to integrated circuit transistors in general.

Undoubtedly, an inverse-T profile as proposed is disadvantageous as regards capacitive coupling of the gate and drain regions, and detrimental to the speed of the device. Nevertheless, analysis of the structure has shown advantages are to be afforded by using such a profile for the gate region. Some of the above articles in fact show how optimizing dosage of the low-doped regions and overlap length may minimize the above drawback and so limit the theoretical coupling increase to 10%, the consequences of which are further reduced by virtue of a big improvement in the source and drain series resistance values.

SUMMARY OF THE INVENTION

It is an object of the present invention to provide integrated devices, based on the principle of partially overlapping the gate region on low-doped regions with an LDD type structure; which provides for eliminating the drawbacks typically associated with known devices, for enabling troublefree, low-cost implementation, and for ensuring the production of high-performance devices.

According to the present invention, there is provided a device as claimed herein, the invention being defined by the claims and not limited to the preferred embodiment.

BRIEF DESCRIPTION OF THE DRAWINGS

A preferred non-limiting embodiment of the present invention, relative to a non-volatile memory, will be described with reference to the accompanying drawings, in which.

DETAILED DESCRIPTION OF THE INVENTION

The accompanying drawings show intermediate structures formed in the fabrication of a device according to the present invention, and relative to an EPROM memory and a pair of CMOS transistors, each integrated in a respective tub according to the twin tub process.

Figure 1:
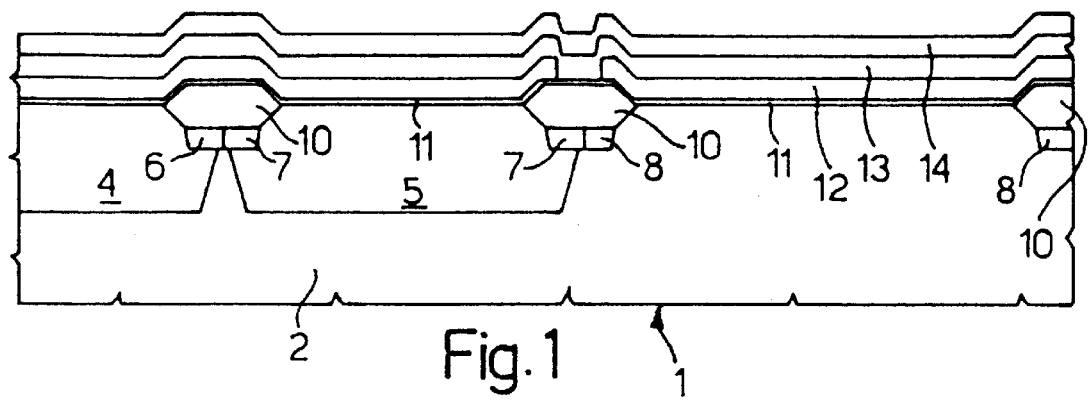
FIGS. 1 to 6 show cross sections of a wafer of semiconductor material at various stages in the fabrication of a device according to the present invention.
Figure 7:
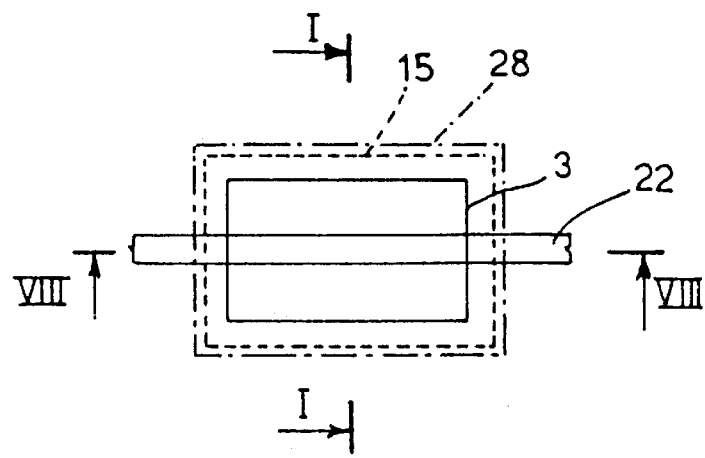
FIG. 7 shows a schematic view of the masks employed for the memory circuit transistors.

As shown in FIG. 1, the method of fabrication of a device according to the present invention commences with a silicon wafer 1 including a substrate 2 having twin tubs 4 and 5 of opposite conductivity, for housing respective circuit MOS transistors such as those in the peripheral circuit, as one example. The active areas are defined on wafer 1 using standard masking processes (the relative mask is shown by continuous line 3 in FIG. 7, which shows, one on top of the other, the various masks employed in the method described herein for one of the circuit transistors), and isolation regions 6, 7, 8 of appropriate conductivity are implanted between the active areas. The field oxide is then grown (to form regions 10), and an N type implant made in the memory cell area (right half of FIG. 1). Sacrificial oxidation is then effected, in known manner, on the active areas, and, following removal of the oxide layer so formed, gate oxide 11 (FIG. 1) is grown thermally. On top of gate oxide 11, a layer of polycrystalline silicon (first poly 12), appropriately doped to improve conductivity, is grown and then shaped by means of standard masking and etching operations, so as to produce, in the memory cell area, polysilicon strips extending parallel to strip 12 in FIG. 1 and in a plane perpendicular to that of the drawing.

On top of first poly 12, a layer of dielectric material (dielectric interpoly 13) is formed, and a suitably thick second polysilicon layer (second poly 14) is deposited for protecting dielectric layer 13, and so producing the intermediate structure shown in FIG. 1.

Figure 2:
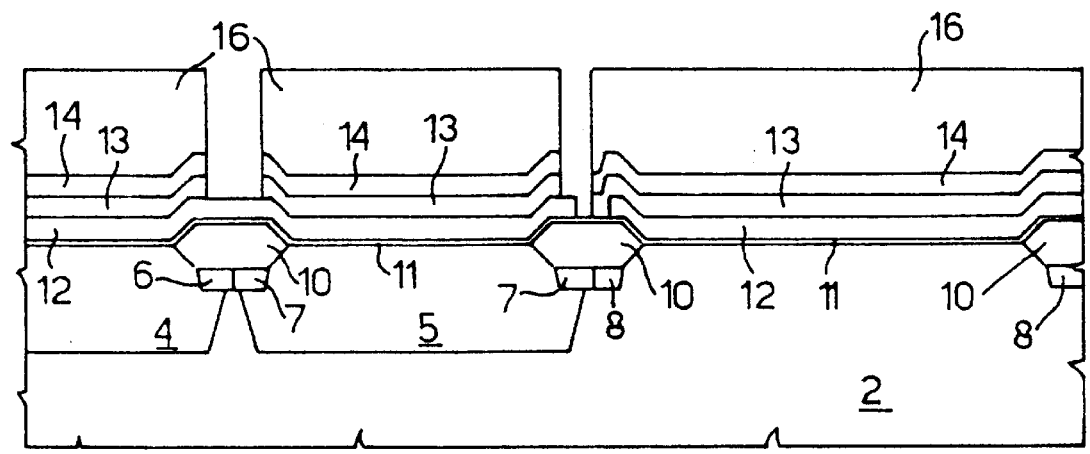

An array mask is then deposited, so that a suitably shaped resist layer 16 covers the whole of polysilicon layer 14 in the memory cell area, and the active areas in the circuitry area. The design of the photolithographic mask at this stage differs as compared with that of standard processes, and, for a circuit transistor, is as shown by dotted line 15 in FIG. 7. The portions of polysilicon layer 14 and dielectric layer 13 not covered by resist layer 16 are then removed by plasma etching, to give the intermediate structure shown in FIG. 2.

Figure 3:
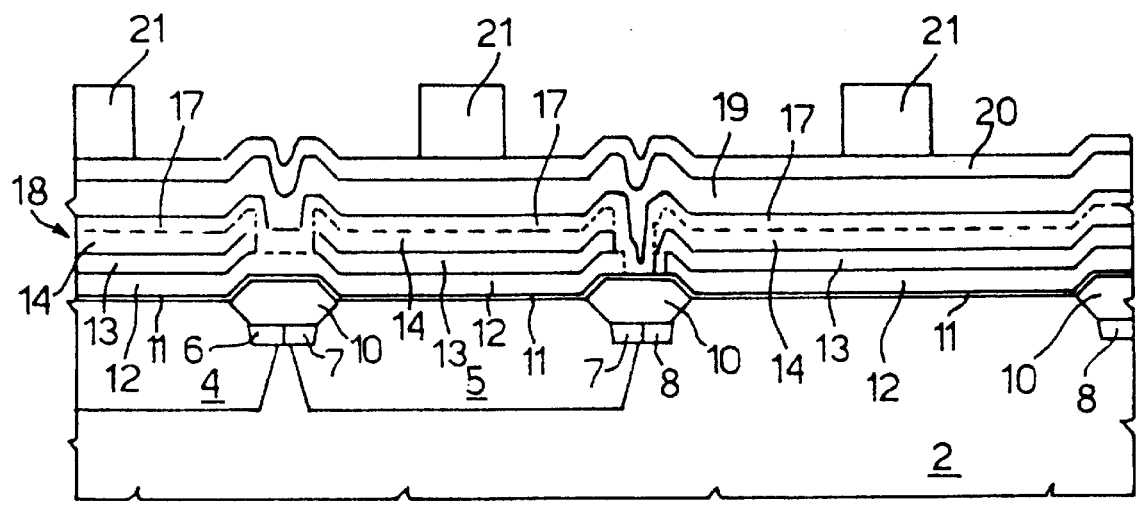

Following removal of resist layer 16, a threshold adjusting implant is made in the circuit transistor active area outside the memory cell array, and a third polycrystalline silicon layer 17 (FIG. 3) is deposited. Layer 17 is physically deposited onto the exposed areas and thus is in direct electrical contact with first poly layer 12 where second poly 14 and dielectric layer 13 have been removed (over field oxide regions 10 surrounding each circuit transistor, as shown also in the FIG. 8 section), and elsewhere is in direct electrical contact with second poly layer 14 (over the active areas of the circuitry and in the memory cell area) according to a selected masking pattern. Hereinafter, the layer resulting from overlapping layers 14 and 17 will be referred to as layer 18, since it does in fact act as a single layer. The top layer 17 is then appropriately doped to improve conductivity.

In summary, where it is desired to form a floating gate, the poly layer 17 contacts the second poly layer 14 but does not contact the first poly layer 12. Second poly layer 14 and first poly layer 12 remain electrically insulated from each other. On the other hand, where it is desirable to form a standard MOS transistor with first poly 12 as the gate of a standard MOS transistor, the masking pattern is selected to expose both poly layers 12 and 14 when poly layer 17 is deposited such that poly layers 12 and 14 are physically connected via layer 17 and are electrically short circuited together. The transistors that are selected to be shorted together include circuit transistors is the peripheral circuitry and other circuit transistors on the chip as the circuit designs may select.

A 2500 Å thick silicide layer 19 ($WSi_2$) is then deposited and, over this, an LPCVD silicon oxide layer 20. The LPCVD silicon oxide layer 20 is not present in prior art processes and the etching of it is thus not necessary in these prior art processes. A suitably shaped photoresist layer is then deposited for defining the memory cell control gates and the circuit transistor gate regions, and so producing the structure shown in FIG. 3, which also shows resist layer 21 after shaping. The relative mask is also shown by continuous line 22 in FIG. 7.

Figure 4:
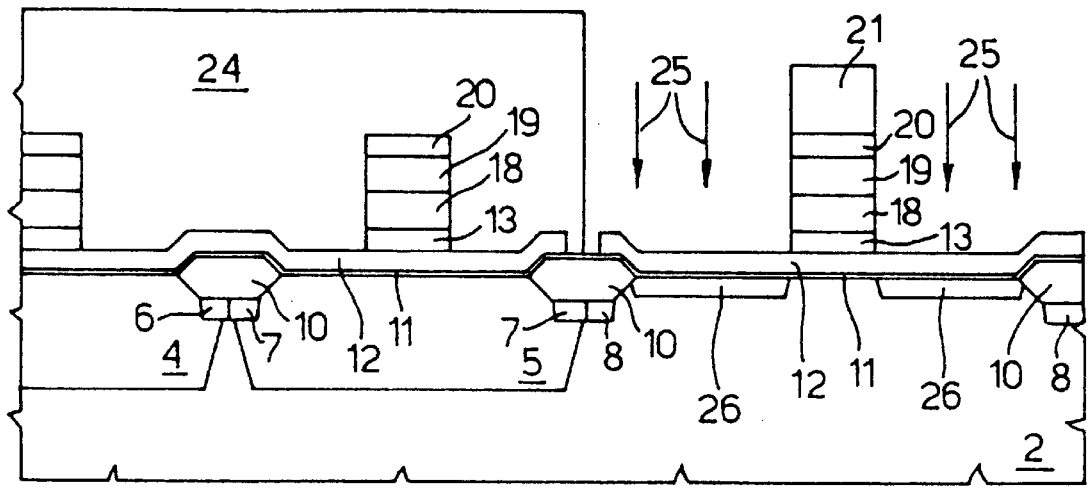

At this point, oxide layer 20, silicide layer 19, polysilicon layer 17 and layer 14 (if any) are plasma etched down to dielectric layer 13, which thus acts as a gate etching stop layer when defining the gate. Using the same mask, dielectric layer 13 is then etched by means of a further, polysilicon-selective, etching operation; a further resist mask 24 (FIG. 4) is deposited over mask 21, so as to leave only the memory cells exposed; and N type doping ions (e.g., a 7E13 at/$cm^2$ dose of phosphorous at 80 KeV) are implanted through first polysilicon layer 12 and gate oxide layer 11, as shown by arrows 25 in FIG. 4, so as to form, in the cell area of substrate 2, low-doped regions 26 aligned with the shaped stack formed by layers 13, 18, 19, 20, and so produce the intermediate structure shown in FIG. 4.

Following removal of the double resist layer 21, 24, a further resist layer is deposited and selectively etched with a masking pattern (not shown in FIGS. 1–6 but the shape of which, for a single transistor, is shown by dot-and-dash line 28 in FIG. 7) for implanting N type doping ions through first polysilicon layer 12 in the N channel transistor active areas of the circuitry as selected. At this stage, a 6E13 at/cm² dose of phosphorous at 110 KeV is typically employed, for producing regions 29 in tubs 5 (FIG. 5).

Following removal of the above mask, a further mask layer (of the same shape as mask 28) is deposited for implanting P type doping ions through first polysilicon layer 12 in the P channel transistor active areas of the peripheral circuitry. At this stage, a 3.5E13 at/cm² dose of boron at 45 KeV is typically implanted, for producing regions 30 in tubs 4 (FIG. 5).

Figure 5:
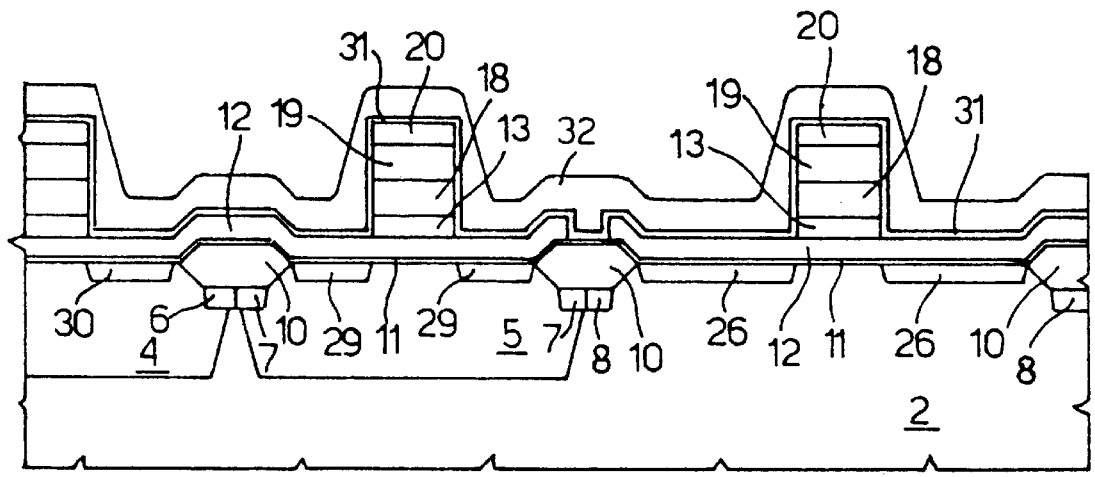

Following removal of the above mask, the overlapping layers in the stack are re-oxidized laterally in a controlled atmosphere to form a thin oxide layer 31 (FIG. 5); and an LPCVD silicon oxide layer 32 is deposited, to produce the intermediate structure shown in FIG. 5.

Oxide layer 32 is plasma etched immediately to form lateral spacers 33 (FIG. 6) to the side of stacked silicide and polysilicon layers 19 and 18. The deposition and subsequent etching of the upper oxide layer 32 to form the described lateral spacers is one of novel features contributed by one embodiment of the present invention.

Figure 6:
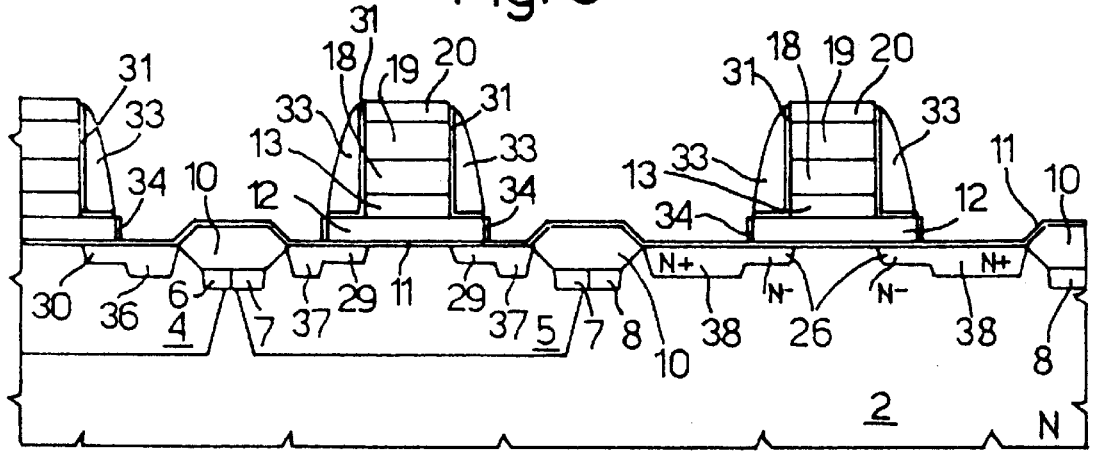
Figure 8:
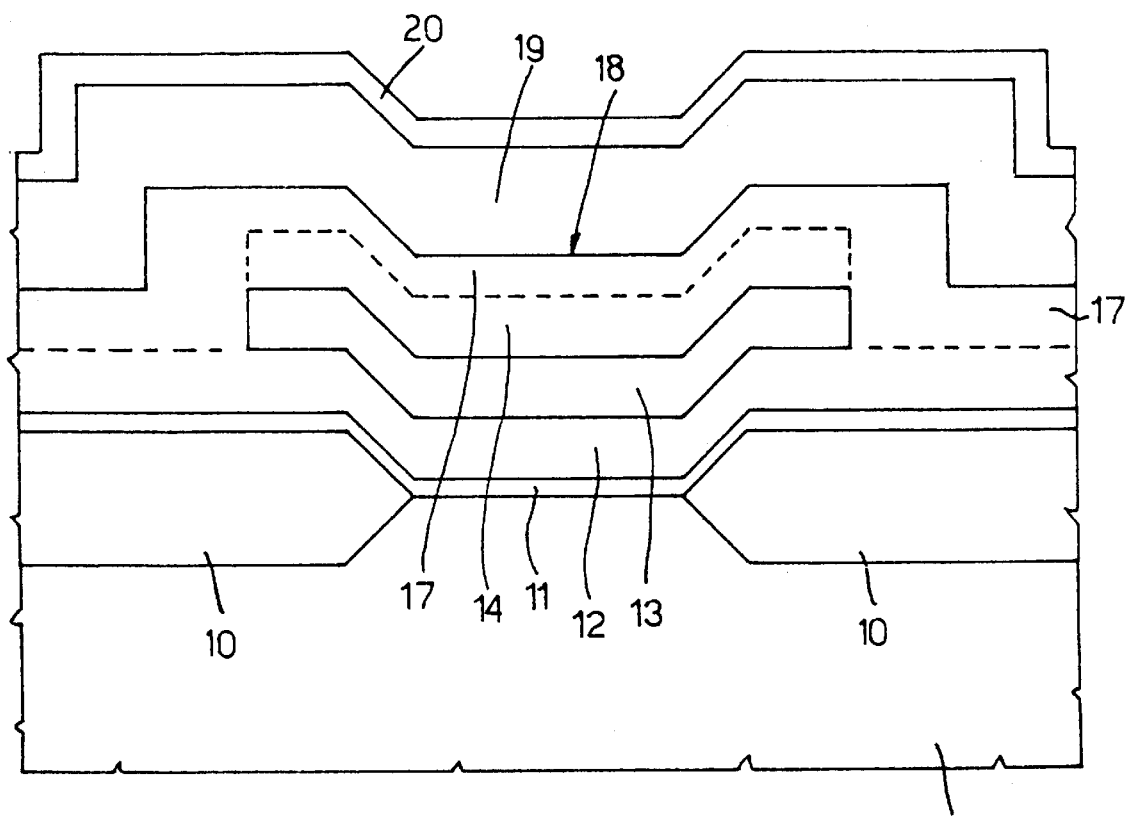
FIG. 8 shows a cross section of a circuit transistor, perpendicular to the FIGS. 1–6 section.

By means of further plasma etching, first polysilicon layer 12 is then shaped so that, as shown in the FIG. 6 section, it is self-aligned with spacers 33, thus defining the floating gate of the memory cells (to the right in FIG. 6) and also the bottom part of the gate region of any transistor, which has previously been short circuited at the top part defined by layer 14 in regions on the chip up- and downstream from the FIG. 6 plane, as shown in FIG. 8.

Following minor protective re-oxidation (thin layers 34) of the lateral surface of layer 12 exposed by the above plasma etching surface of layer 12 exposed by the above plasma etching operation, appropriate masks (similar to 28) are deposited for making an N type and P type implant self-aligned with the gate regions formed by the remaining portions of layer 12, and so forming regions 36, 37, 38 (the first a P type and the other two N types) in tubs 4, tubs 5 and memory cell substrate 2, respectively. The resulting intermediate structure is as shown in FIG. 6. Transistors and cells similar in structure to known LDD (Light Doped Drain) devices are thus obtained, but in which, by virtue of the method employed, the bottom part of the gate region in the transistors, and the floating gate in the cells partially overlap the low-doped regions.

The method then continues with the usual steps presently known in the art including: depositing a dielectric layer in which the contacts are defined; depositing and shaping a metal layer; and, finally, depositing a final passivation layer for externally insulating the memory.

The advantages of the method according to the present invention will be clear from the foregoing description. Firstly, by virtue of the ITLDD structure, it provides for producing transistors of improved performance, particularly as regards hot-carrier reliability, which is especially advantageous in the case of line decoding transistors subjected to high voltages.

Secondly, it provides for forming the memory cells in the same steps for forming circuit transistors and any other transistors on the chip that are not selected to be floating gate transistors by selectively utilizing a double short circuited poly concept on selected transistor structures. Thus enabling, as far as peripheral circuit transistors are concerned, low-cost production of devices otherwise involving unusual or unfeasible manufacturing processes.

To those skilled in the art it will be clear that changes may be made to the method and device as described and illustrated herein without, however, departing from the scope of the present invention.

Finally, the method according to the present invention also applies not only to memory-integrated but also to integrated circuit transistors in general, thus eliminating the manufacturing and implementation drawbacks mentioned previously and typical of known processes.

According to one alternative embodiment, the first insulation layer is selectively etched to expose selected portions of the first polysilicon layer prior to the second polysilicon layer being deposited such that when the second polysilicon layer is deposited, it directly contacts the first polysilicon without the need for the third polysilicon layer to be deposited to form the electrical interconnect.

The third polysilicon layer is thus not necessary in this alternative embodiment.

To those skilled in the art it will be clear that the changes may be made to the method and device as described and illustrated herein without, however, departing from the scope of the present invention.

We claim:

1. An integrated circuit that includes a plurality of non-volatile memory cells and a plurality of transistors in a substrate of semiconductor material, the integrated circuit comprising:
   a plurality of first polycrystalline silicon gate regions, each of said first gate regions having a first length in a first direction;
   a plurality of second polycrystalline silicon gate regions, each of said second gate regions having a second length in the first direction, the second length being smaller than the first length in the first direction, each of said second gate regions overlying each of said first gate regions; and
   a selectively etched layer of insulating material extending in a second direction between each of said first and second gate regions, each of said second gate regions include first and second gate portions that are respectively electrically connected to in the second direction and electrically insulated from in the first direction, each of said first gate regions.

2. The integrated circuit of claim 1 wherein:
   the second gate region and the first gate region of each of the plurality of transistors are electrically connected to each other to define a plurality of transistor gates.

3. The integrated circuit of claim 2 wherein:
   each of the second gate regions is electrically connected to the corresponding first gate region outside the c active area of the corresponding transistor formed thereby.

4. The integrated circuit of claim 1 wherein:
   said layer of insulating material is formed from dielectric material.

5. An integrated circuit that includes a plurality of non-volatile memory cells and a plurality of transistors in a substrate of semiconductor material, the integrated circuit comprising:
   a plurality of first polycrystalline silicon gate regions, each of said first gate regions having a first length in a first direction;
   a plurality of second polycrystalline silicon gate regions, each of said second gate regions having a second length in the first direction, the second length being longer than the first length in the first direction, each of said first gate regions overlying each of said second gate regions;

a selectively etched layer of insulating material between each of said first and second gate regions, said plurality of second gate regions including a first group of said second gate regions that are electrically connected to a first group of said first gate regions and including a second group of said second gate regions that are electrically insulated from a second group of said first gate regions; and lateral spacers of insulating material on the sidewalls of each of said first gate regions that define said first length of each of said first gate regions in the first direction.

6. An integrated device in a substrate of a semiconductor material, the integrated device comprising:

a first polycrystalline silicon gate region of a first length in a first direction;

a layer of insulating material overlying said first gate region, said layer of insulating material having a width in a second direction perpendicular to the first direction;

a second polycrystalline silicon gate region overlying said layer of insulating material, said second gate region having a second length in the first direction, the second length being less than the first length, said second gate region being in direct electrical contact with said first gate region at least at a portion of said second gate region extending from said insulating material and in the second direction;

first substrate regions embedded in the substrate laterally and externally in relation to said first gate region, said first substrate regions having a first doping level; and second substrate regions embedded in the substrate laterally in relation to said second gate region, to the sides of said first substrate regions, and beneath said first gate region, said second substrate regions having a second doping level lower than the first doping level.

7. A device as claimed in claim 6 wherein:

said first substrate regions are self-aligned with said first gate region; and said second substrate regions are self-aligned with said second gate region.

8. A device as claimed in claim 6 wherein said layer of insulating material is formed from dielectric material.

9. The device as claimed in claim 6, further comprising:

lateral spacers of insulating material on opposing sidewalls of said second gate region, that define said second length of the second gate region in the first direction.

* * * * *